(12) United States Patent
Buffa et al.

(10) Patent No.: US 10,886,930 B1
(45) Date of Patent: Jan. 5, 2021

(54) VOLTAGE CONTROLLED OSCILLATOR BASED ANALOG-TO-DIGITAL CONVERTER INCLUDING A MAXIMUM LENGTH SEQUENCE GENERATOR

(71) Applicant: Infineon Technologies AG, Neubiberg (DE)

(72) Inventors: Cesare Buffa, Villach (AT); Luis Hernandez-Corporales, Madrid (ES); Carlos Andres Perez Cruz, Santa Cruz del Retamar (ES); Andres Quintero Alonso, Leganés (ES); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/526,346

(22) Filed: Jul. 30, 2019

(51) Int. Cl.
*H03M 1/06* (2006.01)
*H03K 23/54* (2006.01)
*H03K 3/03* (2006.01)

(52) U.S. Cl.
CPC ........ *H03M 1/0602* (2013.01); *H03K 3/0315* (2013.01); *H03K 23/542* (2013.01)

(58) Field of Classification Search
CPC .. H03M 1/0602; H03K 3/0315; H03K 23/542
USPC ................. 341/118, 155, 133, 164
See application file for complete search history.

(56) References Cited

U.S. PATENT DOCUMENTS

| | | | |
|---|---|---|---|
| 4,569,599 A * | 2/1986 | Bolkow | G04F 10/00 356/5.08 |
| 4,756,011 A | 7/1988 | Cordell | |
| 7,750,685 B1 * | 7/2010 | Bunch | H03L 7/087 327/23 |
| 7,791,525 B2 * | 9/2010 | Rivoir | G04F 10/005 341/155 |
| 9,213,316 B2 * | 12/2015 | Suma Vinay | G04F 10/105 |
| 9,369,263 B1 | 6/2016 | Baecher et al. | |
| 9,813,282 B2 | 11/2017 | Liu et al. | |
| 10,520,901 B2 * | 12/2019 | Wu | G04F 10/005 |

OTHER PUBLICATIONS

Daniels, J., et al., "All-Digital Differential VCO-based A/D Conversion," Proceedings of 2010 IEEE International Symposium on Circuits and Systems, Paris, May 30-Jun. 2, 2010, pp. 1085-1088.
Kim, Jaewook et al., "Analysis and Design of Voltage-Controlled Oscillator Based Analog-to-Digital Converter," in IEEE Transactions on Circuits and Systems—I: Regular Papers, vol. 57, No. 1, Jan. 2010, pp. 18-30.

(Continued)

*Primary Examiner* — Peguy Jean Pierre
(74) *Attorney, Agent, or Firm* — Slater Matsil, LLP

(57) ABSTRACT

An analog-to-digital converter includes a ring oscillator having an input for receiving an analog signal, a coarse counter including a maximum length sequence generator having an input coupled to the output of the ring oscillator, a fine counter including a Johnson counter having an input coupled to the output of the ring oscillator, and a difference generator having a first input coupled to the output of the coarse counter, a second input coupled to the output of the fine counter, and an output for providing a digital signal corresponding to the analog signal.

25 Claims, 11 Drawing Sheets

(56) References Cited

OTHER PUBLICATIONS

Schreier, Richard et al., "Understanding delta-sigma data converters," ISBN: 978-0-471-46585-0, Piscataway, NJ: Wiley-IEEE Press Home, Circuits and Systems, Circuits and Components, Nov. 2004, 464 pages.

Unnikrishnan, V., et al., "Mitigation of Sampling Errors in VCO-Based ADCs," in IEEE Transactions on Circuits and Systems I: Regular Papers, vol. 64, No. 7, pp. 1730.

Watanade, Takamoto et al., "An All-Digital Analog-to-Digital Converter with 12-μV/LSB Using Moving-Average Filtering," in IEEE Journal of Solid-State Circuits, vol. 38, No. 1, Jan. 2003, pp. 120-125.

\* cited by examiner

| VCO inverters | Clock phases | MLS generator | Johnson Counter |
|---|---|---|---|
| inv<0> | P<0> | — | CJC<0> |
| inv<2> | P<1> | CMLS<1> | CJC<1> |
| inv<4> | P<2> | CMLS<2> | CJC<2> |
| inv<6> | P<3> | CMLS<3> | CJC<3> |
| inv<1> | P<4> | CMLS<4> | CJC<4> |
| inv<3> | P<5> | CMLS<5> | CJC<5> |
| inv<5> | P<6> | — | CJC<6> |

FIG. 2

| XNOR | | | Switch | | |
|---|---|---|---|---|---|
| A | B | Output | True | False | Output |
| TH<0> | TH<0> | ME<0> | -- | -- | -- |
| TH<1> | TH<0> | ME<1> | RG_SQ_<1> | RG_SQ_<2> | MUX<3> |
| TH<2> | TH<0> | ME<2> | RG_SQ_<2> | RG_SQ_<3> | MUX<2> |
| TH<3> | TH<0> | ME<3> | RG_SQ_<3> | RG_SQ_<4> | MUX<1> |
| TH<4> | TH<0> | ME<4> | RG_SQ_<4> | RG_SQ_<5> | MUX<0> |
| TH<5> | TH<0> | ME<5> | -- | -- | -- |
| TH<6> | TH<0> | ME<6> | -- | -- | -- |

FIG. 5

| MLS | | | | BINARY | | | |
|---|---|---|---|---|---|---|---|
| Mux<3> | Mux<2> | Mux<1> | Mux<0> | B<3> | B<2> | B<1> | B<0> |
| 0 | 0 | 0 | 0 | 0 | 0 | 0 | 0 |
| 0 | 0 | 0 | 1 | 0 | 0 | 0 | 1 |
| 0 | 0 | 1 | 1 | 0 | 0 | 1 | 0 |
| 1 | 1 | 1 | 1 | 0 | 0 | 1 | 1 |
| 1 | 1 | 1 | 0 | 0 | 1 | 0 | 0 |
| 1 | 0 | 0 | 1 | 0 | 1 | 1 | 0 |
| 0 | 1 | 1 | 1 | 0 | 1 | 1 | 1 |
| 1 | 1 | 0 | 0 | 1 | 0 | 0 | 0 |
| 1 | 0 | 1 | 1 | 1 | 0 | 0 | 1 |
| 0 | 0 | 0 | 1 | 1 | 0 | 1 | 0 |
| 0 | 1 | 1 | 0 | 1 | 0 | 1 | 1 |
| 1 | 0 | 1 | 0 | 1 | 1 | 0 | 0 |
| 0 | 1 | 0 | 1 | 1 | 1 | 0 | 1 |
| 1 | 0 | 0 | 0 | 1 | 1 | 1 | 0 |
| 1 | 0 | 0 | 0 | 1 | 1 | 1 | 1 |

FIG. 6

$Tp \gg TsetupFF$ $Tp < TsetupFF$ $Tp < TsetupFF$
Only if $Td > TsetupFF$ $Tp < TsetupFF$

VOLTAGE CONTROLLED OSCILLATOR BASED ANALOG-TO-DIGITAL CONVERTER INCLUDING A MAXIMUM LENGTH SEQUENCE GENERATOR

TECHNICAL FIELD

The present invention relates generally to a voltage controlled oscillator (VCO) based analog-to-digital converter (ADC) including a maximum length sequence (MLS) generator.

BACKGROUND

Low cost digital microphones typically include a biasing circuit followed by an analog-to-digital converter. The competitiveness of a microphone in the marketplace is mainly given by its performance (power consumption, dynamic range, resolution, as well as other performance features) and its cost (silicon area, package size versus sensitivity, as well as other cost drivers). Sigma Delta ADCs currently available have been pushed to technology limits and market trends require innovative solutions. VCO-based ADCs are promising alternatives to the conventional voltage encoding-based circuits. For a VCO-ADC built with a multiphase Ring Oscillator (RO), the area and power consumption of the quantization circuitry can be reduced with a coarse-fine quantization architecture, using a counter for the integer phase progression (multiples of $2\pi$), and a fine quantization for the fractional part of the phase progression. However, errors resulting from the desynchronization between the coarse and the fine phase estimations, and those caused by direct sampling of the phases, may compromise the ADC performance.

SUMMARY

According to an embodiment, an analog-to-digital converter comprises a ring oscillator having an input for receiving an analog signal, and an output; a coarse counter comprising a maximum length sequence generator having an input coupled to the output of the ring oscillator, and an output; a fine counter comprising a Johnson counter having an input coupled to the output of the ring oscillator, and an output; and a difference generator having a first input coupled to the output of the coarse counter, a second input coupled to the output of the fine counter, and an output for providing a digital signal corresponding to the analog signal.

According to another embodiment, a method for converting an analog signal into a digital output comprises converting the analog signal into a plurality of phase signals including a primary phase signal and a secondary phase signal; registering edges of the primary phase signal using a maximum length sequence code count; calculating a number of the registered edges of the primary phase signal during a sampling period; estimating a coarse output based upon the calculated number of registered edges of the primary phase signal during the sampling period; registering edges of the secondary phase signal using a Johnson counter; calculating a number of the registered edges of the secondary phase signal during the sampling period; generating a correction output based upon the calculated number of registered edges of the secondary phase signal during the sampling period; and adding the coarse output and the correction output together to provide the digital output.

According to another embodiment, an analog-to-digital converter comprises a ring oscillator having an input for receiving an analog signal, and an output; a maximum length sequence generator having an input coupled to the output of the ring oscillator, and an output; a Johnson counter having an input coupled to the output of the ring oscillator, and an output; and an adder having a first input coupled to the output of the maximum length sequence generator, a second input coupled to the output of the Johnson counter, and an output for providing a digital signal corresponding to the analog signal.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a table of a first set of internal signals associated with the ADC of FIG. 1B;

FIG. 5 is a table of a second set of internal signals associated with the ADC of FIG. 1B;

FIG. 6 is a table of a third set of internal signals associated with the ADC of FIG. 1B;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Embodiment circuits and methods perform quantization of a multiphase VCO-based ADC, with a significant reduction in power requirements and a significant reduction in metastability and desynchronization errors over prior art ADC solutions. Embodiment ADC circuits include a coarse counter having an MLS generator and a fine counter having a Johnson counter. The MLS generator is configured to perform phase accumulation and the Johnson counter is configured to correct metastability problems. The outputs of the of coarse counter and the fine counter are combined to provide a composite digital output signal that is accurately representative of an analog signal presented to the input of the ADC.

ADC implementations comprising a coarse counter and a fine counter whose outputs are summed together to provide a digital output signal representative of an analog input signal can exhibit errors caused by the asynchrony between the coarse and fine counters, or by metastability when sampling the phases of the input ring oscillator. These effects may appear as large errors (or spikes) at the ADC output, affecting the signal-to-noise ratio (SNR) of the ADC.

Embodiment ADC implementations advantageously reduce power consumption and solve the metastability and synchronization problems by introducing a combined MLS generator and Johnson counter architecture for the quantization circuitry of the multiphase ring oscillator. These ADC embodiments allow a reduction in the power consumption compared to prior art solutions due to the simplicity of the MLS generator structure, and also allow a reduction in the asynchrony and metastability errors due to the advantageous alignment of the counting function with respect to the ring oscillator phase detection provided by the ADC components as is described in detail below.

Figure 1A:
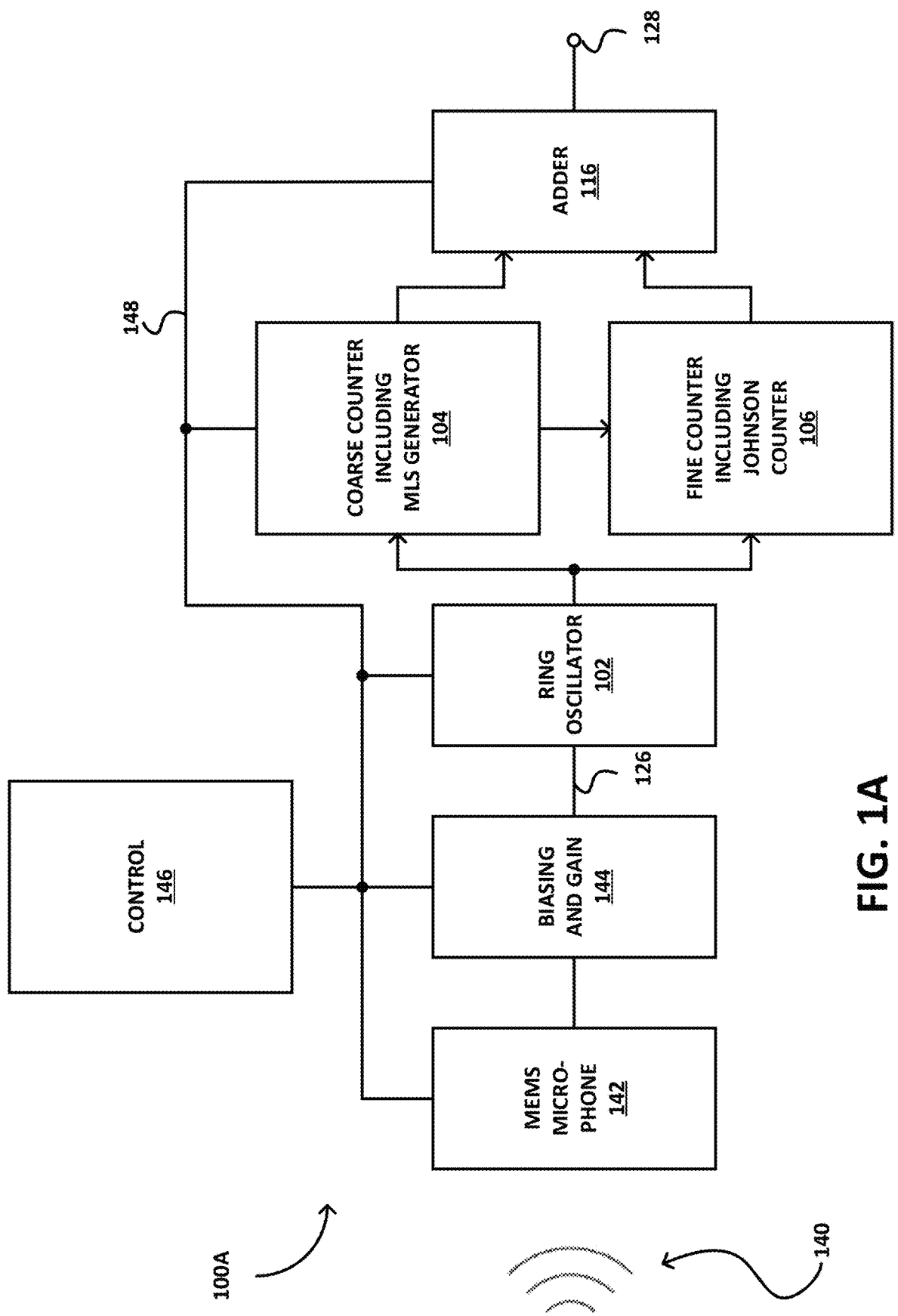
FIG. 1A is a block diagram of an ADC coupled to a MEMS microphone according to an embodiment.

FIG. 1A is a high level block diagram 100A of a microphone coupled to an ADC according to an embodiment. The microphone 142 includes a variable capacitor, for example a Micro Electro Mechanical System (MEMS) solid state variable capacitor, coupled to biasing and gain (amplification) circuitry 144 for receiving audio signals 140 and for generating an analog signal such as an analog voltage at ADC input node 126. The ADC converter includes a ring oscillator 102 having an input for receiving the analog signal, and a plurality of outputs for generating a plurality of phase signals, whose frequency changes with the varying amplitude of the analog signal. A coarse counter 104 including an MLS generator has an input for receiving a first set of the plurality of phase signals. A fine counter 106 including a Johnson counter has an input for receiving a second set of the plurality of phase signals, which can include at least some of the phase signals in the first set of the plurality of phase signals. The output of the coarse counter 104 and the output of the fine counter 106 are scaled and summed together in adder 116. The output of adder 116 is the digital output 128 of the ADC, generating a digital word representing the corresponding analog input signal 126, according to an embodiment. A control block 146 can include one or more memories, a computer or microprocessor(s), a clock (CLK) signal generator, and other functional blocks implemented in software coupled to the hardware blocks or components shown in FIG. 1A through a digital bus 148. Some or all of the blocks or components shown in FIG. 1A can be fabricated together on one or more integrated circuits. For example, the ring oscillator 102, coarse counter 104, fine counter 106, and adder 116 can all be fabricated on a single integrated circuit as a standalone ADC integrated circuit product. In an embodiment, some or all of the components of the block diagram of FIG. 1A can be replicated for a single MEMS microphone to process a differential input signal in order to improve linearity. Additional circuitry and details of the components associated with the block diagram 100A are shown in the detailed ADC 100B block diagram of FIG. 1B and described in further detail below.

Figure 1B:
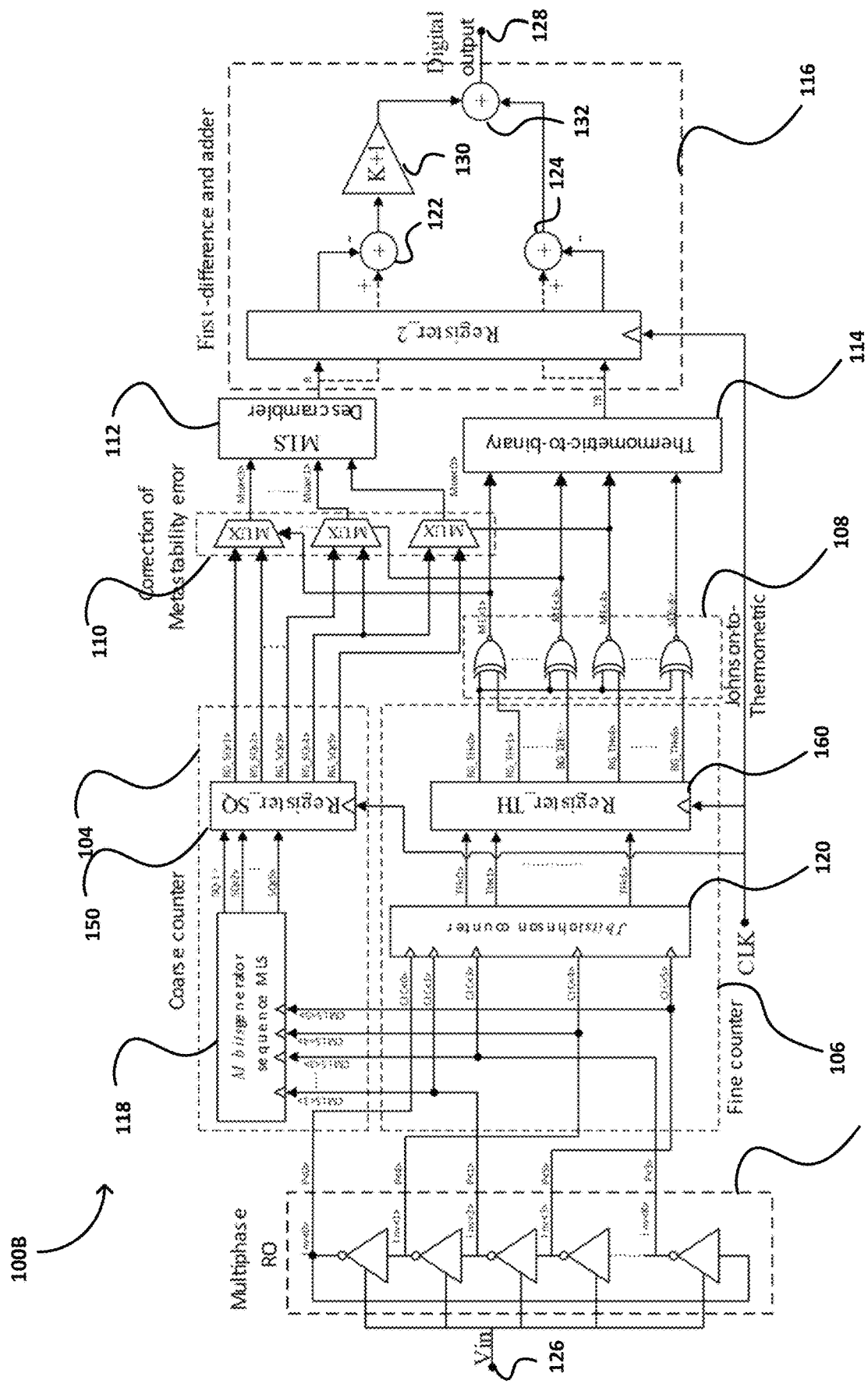
FIG. 1B is a more detailed block diagram of an ADC according to an embodiment.

FIG. 1B shows a more detailed block diagram of a VCO based ADC 100B, or ADC system, according to an embodiment. ADC 100B includes an analog input node or terminal 126 and a digital output node or terminal 128. The digital output signal at output node 128 is a digital code that is representative of the analog input signal at input node 126. ADC 100B comprises a VCO 102, a coarse counter 104 including an MLS generator 118, a fine counter 106 including a Johnson counter 120, a Johnson-to-thermometer code converter 108, a metastability error correction circuit 110, an MLS descrambler 112, and a first-difference and adder block 116. Each component or block in ADC 100B is serially described in further detail below.

VCO 102 is a ring oscillator that comprises an odd plurality of serially coupled inverters in the case of a single-ended implementation, wherein the output of a last inverter is coupled to the input of a first inverter. The outputs of VCO 102 are shown as signals Inv<0>, Inv<1>, Inv<2>, Inv<3>, through Inv<K>. Any odd number of inverters greater than one can be used in VCO 102. VCO 102 is thus a ring oscillator whose output is a set of "K+1" valid digital signals designated Inv<0> through Inv<K> as the outputs of consecutive inverters in the ring, reflecting the input signal in its frequency. These signals are reordered when used in the rest of the digital circuit to P<0> to P<K> to occur in the sequence as is shown in FIG. 1B and in the table of FIG. 2. Note that the successive inverters in the single-ended ring oscillator of VCO 102 comprise a reordering reflected in the signal arrangement shown in FIG. 1B and in the table of FIG. 2 to have consecutive rising edges, by selecting the even numbered inverters first and the odd numbered inverters afterwards before assigning them to outputs P<0> to P<K>. The correspondence between signals Inv and P is described by the following equations in the case of a single ended implementation with K even (odd number of inverters):

$$P<i>=Inv<2*i> \quad i=0 \ldots K/2 \qquad [1],$$

$$P<i>=Inv<2*(i-K/2-1)+1>i=K/2+1 \ldots K \qquad [2].$$

In the case of a differential ring oscillator, the output signals will be chosen between the two possible outputs of every inverter in the ring to have successive rising/falling edges.

The minimum time between two rising edges for any successive phases P<i> and P<i+1> are denoted as $T_{MIN}$ and will correspond to the minimum period of the oscillator divided by K+1. For instance, in FIG. 1B "K" is assigned to be six; K=6 (corresponding to 7 inverters).

The table of FIG. 2 shows the correspondence between the VCO 102 output signals Inv<0> through Inv<6> to the clock phase signals P<0> through P<6>, obtained by equations [i] and [2] set forth above.

Coarse counter 104 includes a Maximum Length Sequence (MLS) generator 118 that can be defined as a type of pseudorandom binary sequence, as is described in further detail below. The MLS generator 118 is a block that can be implemented in software or with a digital logic circuit, with M+1 inputs (M K). The method of operation of MLS generator 118 is further defined using two integers A and B, such that 1≤A≤K−M+1, and B=A+M. The inputs of MLS generator are designated CMLS<A> to CMLS<B> and are connected to the phases of the ring oscillator P<A> to P<B> in a sequence of successive rising (or falling) edges. For example, in FIG. 3 and FIG. 1B, M=4, A=1, B=5 resulting in the correspondence between the CMLS and P signals described in the table of FIG. 2.

Coarse counter 104 also includes a clocked register 150 (which can be referred to as Register$_{SQ}$ or register bank RG$_{SQ}$ that is coupled to the outputs of the MLS generator 118 and is described in further detail below.

Fine counter 106 includes a Johnson counter (JC) 120. The Johnson counter 106 is a block that can be implemented in software or with a digital logic circuit, with J+1 inputs designated CJC<0> to CJC<J> with J M and J K. These inputs are derived from the phases P of the ring oscillator 102 by inserting a digital delay (for instance implemented with two logic inverters or simply by a suitable layout) of approximately $T_D$ seconds, such that $T_D<T_{MIN}$. In the example of FIG. 1B, the assignment between the VCO 102 phases and the Johnson counter 120 inputs is displayed in the table of FIG. 2 assuming J=6. Advantageously, a similar edge ordering between inputs CJC and MLS is observed, and also all of the VCO phases connected to the CMLS inputs are a subset of the VCO phases connected to the CJC inputs for proper operation. CJC<0> is not connected to any CMLS input, in an embodiment.

Fine counter 106 also includes a clocked register 160 (which can also be referred to as Register$_{TH}$ or register bank RG$_{TH}$) that is coupled to the outputs of Johnson counter 120 and is described in further detail below.

Register bank RG$_{SQ}$ samples the MLS generator 118 output SQ<A> to SQ<B> with the system clock (CLK), which is asynchronous to the VCO 102 oscillation. The outputs of register 150 are RG$_{SQ<A>}$ to RG$_{SQ<B>}$. No synchronization between VCO edges and CLK edges is assumed and therefore setup and hold time violations may happen in the flip-flops producing metastability errors. Embodiment ADC systems will advantageously compensate for these metastability errors.

Register bank RG$_{TH}$ samples the Johnson counter 120 outputs TH<0> to TH<J> with the system clock, which is asynchronous to the VCO 102 oscillation. The outputs of register 160 are RG$_{TH}$<0> to RG$_{TH}$<M>. No synchronization between VCO edges and CLK edges is assumed and therefore setup and hold time violations may happen in the flip-flops producing metastability errors. Embodiment ADC systems will advantageously compensate for these metastability errors.

FIG. 1B also shows a Johnson-to-thermometer code converter 108 coupled to the output of register 160. Johnson-to-thermometer code converter 108 is a combinational circuit block (that can be realized in software or in a digital logic circuit) that translates the registered state of the Johnson counter 120 (RG$_{TH}$<0> to RG$_{TH}$<J>) into the number of rising clock edges after the reference phase in the sampling registers. The J output signals (ME<i> to ME<J>) are connected to several multiplexers in the metastability error correction circuit no and a thermometer code-to-binary decoder 114.

The logic function implemented by the Johnson-to-thermometer code converter 108 is defined in a bitwise manner by the following pseudocode:
for i=0:K-1
ME<i>=XNOR(RG$_{TH}$<0>, RG$_{TH}$<i+1>);
end A thermometer code-to-binary converter 114 is coupled to the output of Johnson-to-thermometer code converter 108 in FIG. 1B. Thermometer code-to-binary converter 114 is a combinational circuit block (that can be realized in software or in a digital logic circuit) that translates the thermometer code generated by the Johnson-to-thermometer converter 108 into a binary codeword expressing the number of rising clock edges after the reference phase in the sampling registers. Converter 108 implements a "ones counting" function such that its output TB is the number of ones at inputs M<i> through M<J> expressed as a binary number.

The metastability error correction circuit no shown in FIG. 1B comprises a plurality of multiplexers (MUXes) identified by their output signals Mux<1> through Mux<B−1>. The multiplexers in correction circuit no are responsible for correcting the errors after sampling and restoring the sampled MLS sequence to its proper value in the presence of metastability. Error correction circuit no comprises M digital multiplexers having two inputs coupled to corresponding outputs of register 150 and a select input controlled by a one bit signal ME<i> from the Johnson-to-thermometer code converter 108. When ME<i>=0, a first of the MUX inputs is routed to the output of the MUX, and when ME<i>=1, a second of the MUX inputs is routed to the output of the MUX. The inputs of the multiplexer are connected to signals RG$_{SQ}$<0> to RG$_{SQ}$<J> to implement the following pseudocode:
for i=A:(B−1)
if (ME<i>==1)
MUX<B−i−1>=RG$_{SQ}$<i>
else
MUX<B−i−1>=RG$_{SQ}$<i+1>
end
end The table of FIG. 5 shows an example of the signal connections of the metastability error correction circuit no, register iso, and the Johnson-to-thermometer code converter 108 shown in FIG. 1B, including the TH, ME, RG$_{SQ}$, and MUX signals. This correspondence is described by the pseudocode in the previous paragraph by setting A=1 and B=5.

FIG. 1B also includes an MLS descrambler 112 coupled to the output of correction circuit no. The sampled data of the MLS generator 118 are descrambled and converted to binary code by MLS descrambler 112. The descrambling operation is a combinational circuit or software instructions in a computer or microprocessor implementing a one-to-one relationship between the successive codes on the MLS sequence and the binary numbers between 0 and $2^{M-1}$. An example of such relationship applicable to the example of FIG. 1B is shown in the table of FIG. 6 for M=4.

Finally, FIG. 1B also includes a "first-difference" circuit 116 coupled to the outputs of MLS descrambler 112 and thermometer-to-binary converter n$_4$. Circuit 116 includes a clocked register Register$_2$, "first-difference" adders 122 and 124, multiplier 130, and adder 132 for generating the composite digital output signal at node 128. Register$_2$ samples the data from MLS descrambler 112 and thermometer-to-binary converter 114 to calculate the first difference $(1-Z^{-1})$ thereof. After processing by Register$_2$, the differentiated values of the MLS descrambler 112 are multiplied by the total number of output phase rising edges of the ring oscillator (K+1) by multiplier 130. Similarly, the first difference of the Johnson-to-thermometer converter 114 value is added in adder 132 to obtain the final digital output data at node 128.

Figure 3:
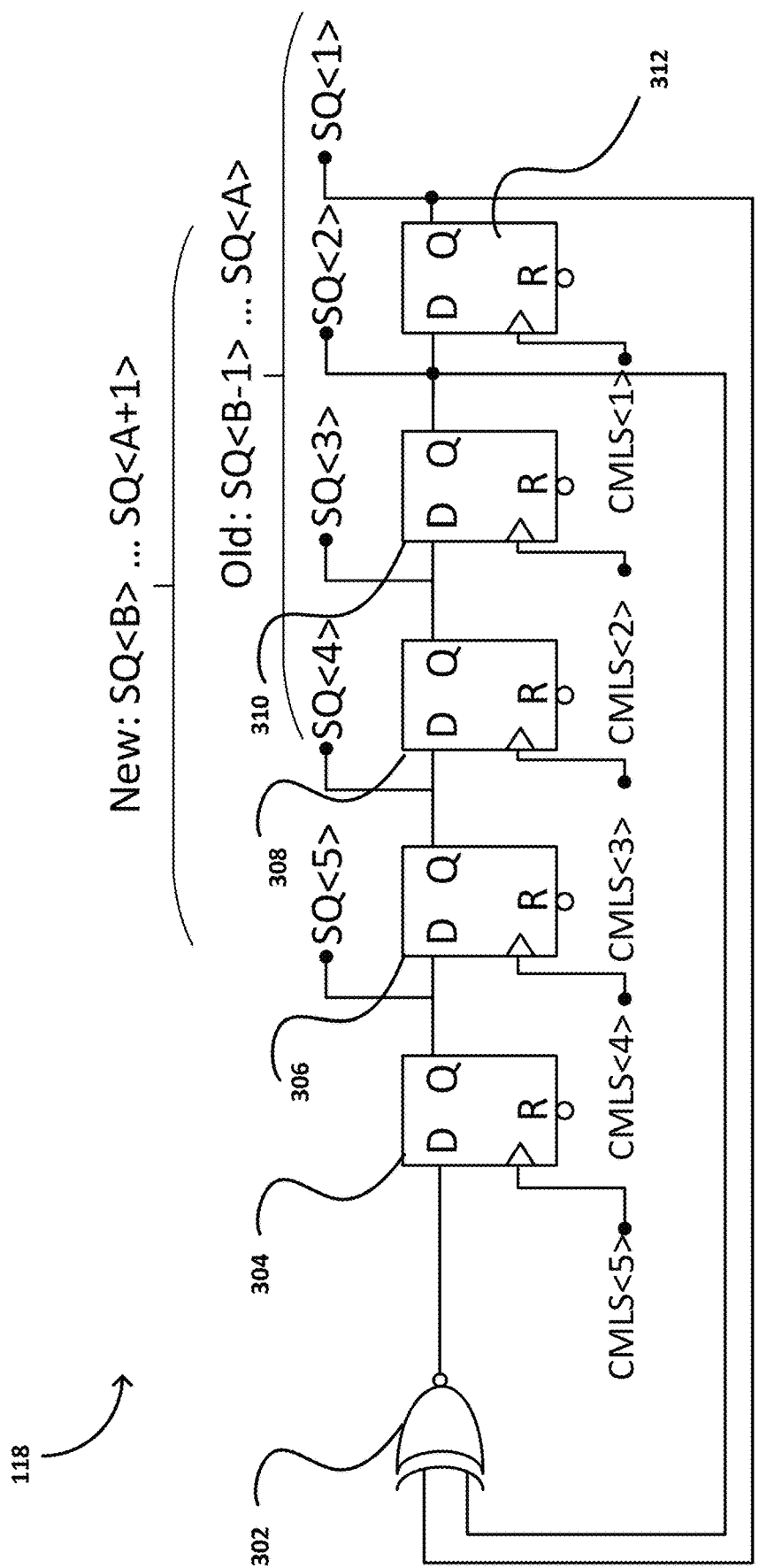
FIG. 3 is a schematic diagram of an MLS generator associated with the ADC of FIG. 1B.

FIG. 3 shows a schematic diagram of MLS generator 118 for the example of FIG. 1B. MLS generator 118 comprises a set of M+1 D-type flip-flops 304, 306, 308, 310, and 312 triggered by the rising (or falling) edge of the CMLS signals and connected as a shift register. The outputs of these flip-flops are signals SQ<A> to SQ<B>. The D input of the first flip-flop 312 (SQ<A>) is connected to a logic function that provides the generation of a so called "Maximum Length Sequence." The maximum length sequence (MLS) can be defined as a type of pseudorandom binary sequence. MLS sequences are bit sequences generated using maximal linear feedback shift registers and are so called because they are periodic and reproduce every binary sequence (except the "all one" vector) that can be represented by the shift registers (i.e., for length-M registers they produce a sequence of length $2^M-1$). In the example of FIG. 3, this logic function is an XNOR gate 302 connected between SQ<5> and SQ<4>. Other logic functions can be used. The output sequence of the MLS generator 118 is provided at outputs SQ<A> through SQ<B−1> and has a period of $2^M-1$ different codes.

As a consequence of the definitions above, outputs SQ<A> through SQ<B−1> of the MLS sequence generator form an output codeword in the sequence that is updated to a new value of the sequence once per cycle of the VCO 102, right after the edge in CMLS<B>. Also, outputs SQ<A+1> through SQ<B> will contain the previous codeword of the MLS sequence. Note that this operation is different from the conventional MLS generator in that the flip-flops of the generator do not trigger simultaneously with the same clock, but in a sequential fashion.

Figure 4:
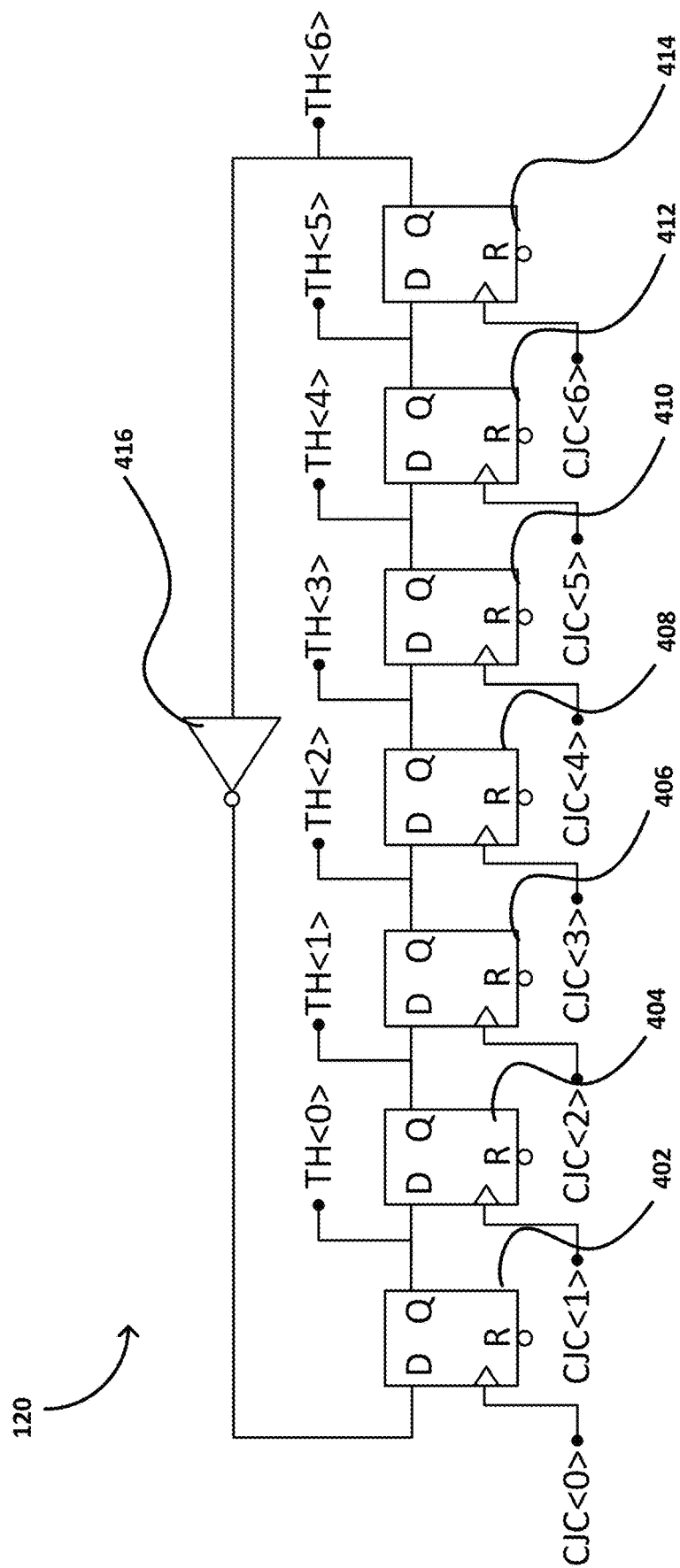
FIG. 4 is a schematic diagram of a Johnson counter associated with the ADC of FIG. 1B.

An example schematic diagram for Johnson counter 120 is shown in FIG. 4. The outputs of Johnson counter 120 are signals TH<0> to TH<J>. FIG. 4 shows an example implementation of the Johnson counter 120 for the example shown in FIG. 1B. The circuit of Johnson counter 120 comprises a shift register implemented with edge triggered D-type flip-flops 402, 404, 406, 408, 410, 412, and 414 whose outputs are signals TH<J> through TH<0>. The clock inputs of Johnson counter 120 are CJC<0> through CJC<J>. The D input of the first flip-flop 402 is coupled to CJC<J> through the output of inverter 416. In this way, the states of the shift register of Johnson counter 120 reflect the codewords generated by a conventional Johnson counter. However, the output codewords are updated to a new value once per clock cycle of the VCO 102, when all its phases have rotated for a full VCO cycle. Note that this operation is different from a conventional Johnson counter in that the flip-flops of the counter do not trigger simultaneously with the same clock, but in a sequential fashion.

Figure 7:
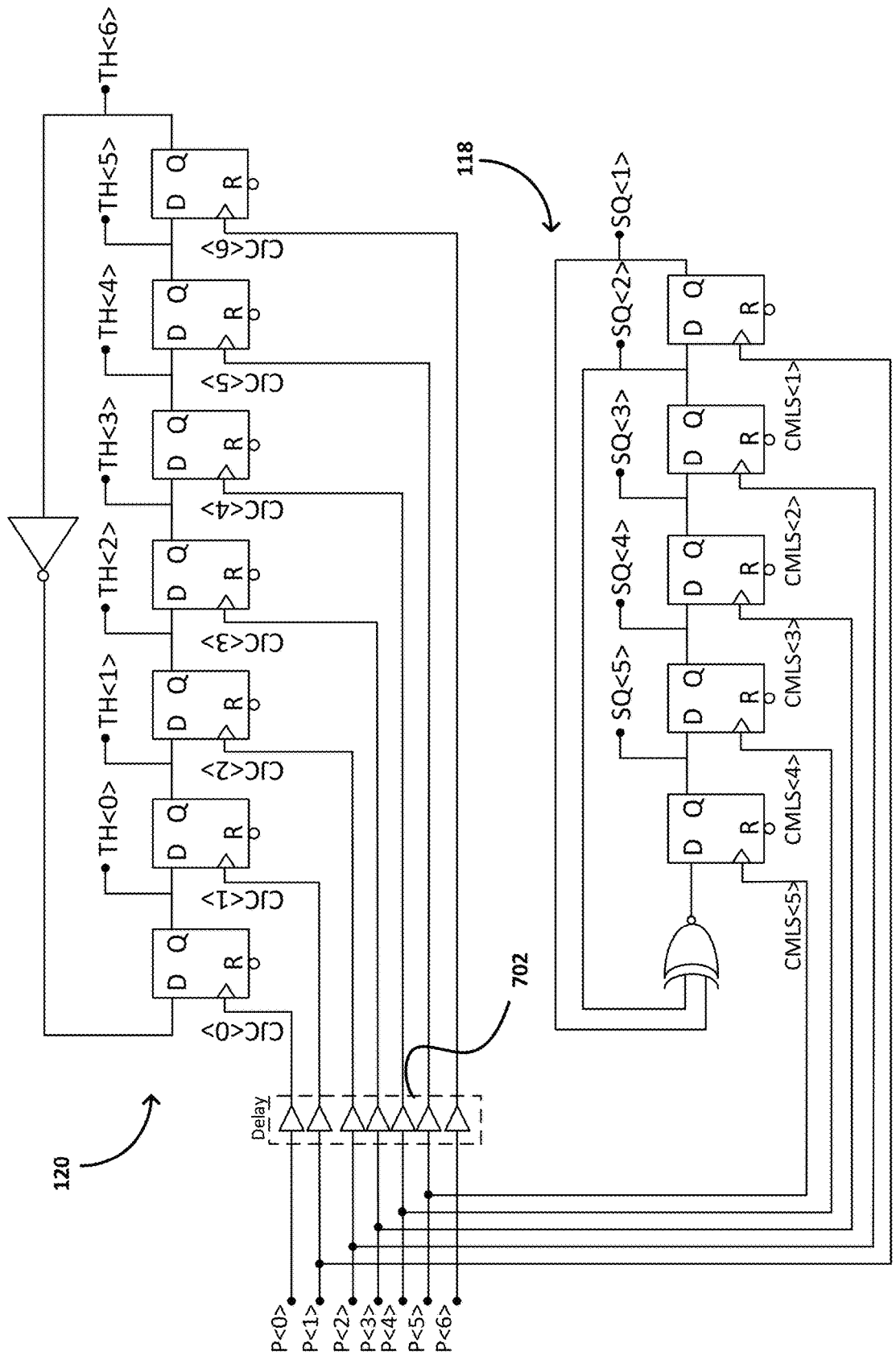
FIG. 7 is a schematic diagram of combined MLS generator and Johnson counter associated with the ADC of FIG. 1B.

To clarify the connection between MLS generator 118 and the Johnson counter 120, FIG. 7 is an example schematic diagram illustrating both circuits together in the example of FIG. 1B. Thus, the schematic diagram of FIG. 7 includes the previously illustrated Johnson counter schematic portion 120, the previously illustrated MLS generator schematic portion 118, as well as an example of the delay circuit 702 not previously shown. Delay circuit 702 can comprise a plurality of parallel digital or analog delay cells or components, or can be implemented by software instructions in a computer or microprocessor. Alternatively, it can be implemented by delaying the clock signals of the sampling registers Register$_{SQ}$ 150 with respect to Register$_{TH}$ 160 in FIG. 1B. In other words, register 160 is clocked first, and then register 150 is clocked second, in an embodiment. The schematic diagram of FIG. 7 clarifies, in part, the relationship between the P, CJC, TH, CMLS, and SQ signals.

The timing diagrams of FIGS. 8A, 8B, 8C, and 8D reproduce the signals of interest in FIG. 1B in order to show an example of the operation of the ADC system, according to an embodiment. The ADC system described herein is configured to count the total number of VCO rising (or falling) edges within a sampling period from the coarse and fine counter outputs both when there is no metastability condition and also when the setup times of some flip-flops in the sampling circuitry are violated producing metastability with a maximum error of one least significant bit (LSB). It should be noted that the VCO signals and the sampling clock are totally asynchronous and therefore their relative timing is totally unpredictable. Any attempt to synchronize both domains will result in Signal-to-Noise Ratio (SNR) corruption.

Therefore, two different operating conditions or situations are defined. One, when there is no setup timing violation (shown in FIG. 8A) and two, when there is a timing violation (shown in FIGS. 8B, 8C and 8D).

Figure 8A:
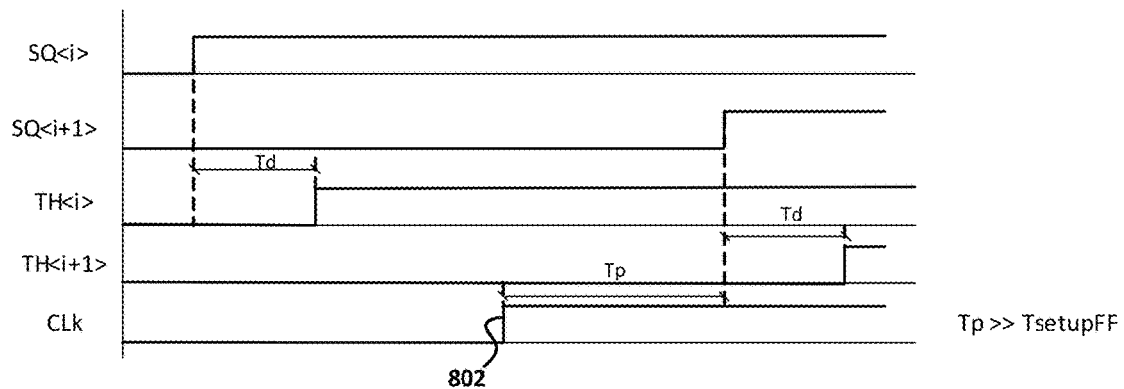
FIGS. 8A, 8B, 8C, and 8D are a first set of timing diagrams associated with the ADC of FIG. 1B.

FIG. 8A is a timing diagram in which the "i$^{th}$" and the (i+1)$^{th}$ CMLS signals (input to the MLS generator 118), the "i$^{th}$" and the (i+1)$^{th}$ CJC signals (input to the Johnson counter 120), and the CLK clock signal are shown in relation to each other. The CMLS signals are also the P output signals of the ring oscillator 102. The CMLS, CJC, P, and CLK signals are all clearly shown in, for example, FIG. 1B.

In the first operating condition a CLK edge 802 transitions between two consecutive VCO edges P<i> and P<i+1> and no time violation is produced in the flip-flops within the sampling registers Register$_{SQ}$ 150 and Register$_{TH}$ 160. Thus, in FIG. 9A, the active system clock CLK edge is assumed to be rising. It is assumed that this rising edge occurs between the VCO rising (or falling) edges of signal P<i> and P<i+1>. The rising edge of the system clock is delayed from the rising edge of P<i+1> by a time T$_P$ that is sufficiently large to guarantee that the flip-flops hold time specification (TholdFF) of sampling registers Register$_{SQ}$ 150 and Register$_{TH}$ 160 is accomplished. Under these conditions, the Johnson counter outputs (TH) will reflect in the sampling instant after the thermometer to binary decoder 114, the total number of VCO edges that occurred right after the MLS count value. Also, the MLS sequence will be updated to the "i$^{th}$" delay cell and the remaining stages will be held to its previous values. Therefore, neither the new nor old value of the MLS sequence are correct at this point. The logic state of the bits of the MLS sequence is as follows:

SQ<B> to SQ<i+1>=incorrect values; and

SQ<i> to SQ<A>=correct values.

To get the correct old and new values of the MLS sequence, the multiplexers no will update the missing shifts in the codeword between bits SQ<B> to SQ<i+1> until the output signals MUX<0> to MUX<M−1> reflects what would have happened if the MLS generator 104 had a chance to update the total length of the MLS sequence and the system clock had appeared after the edge at P<B>.

Figure 8B:
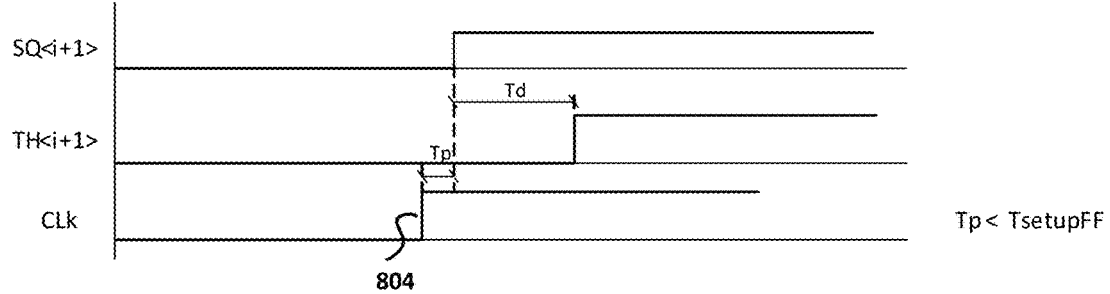

FIG. 8B is a timing diagram in which the signals P<i+1>, CMLS<i>, CJC<i>, and CLK are shown in relation to each other. Each of these signals are shown in FIG. 1B.

In one of the second operating conditions a system CLK edge 804 transitions close to a rising (or falling) edge of the VCO and there is a setup time violation. In FIG. 8B, the CLK rising edge transitions close to the transition of the edge of signal P<i+1>. The rising edge of CLK is delayed from P<i+1> by a time T$_P$ which is smaller than TsetupFF, the setup time specification of the flip-flops in sampling registers Register$_{SQ}$ 150 and Register$_{TH}$ 160. Under these conditions, the MLS generator output SQ<i+1> may not update properly, while SQ<i> is being updated. Also, in this condition, the Johnson counter 120 output TH<i+1> may not have updated because the Johnson counter 120 triggers T$_D$ seconds after the corresponding SQ<i+1> output has updated and output TH<i> has updated. Under these conditions, the Johnson counter 120 outputs (TH) will reflect, in the sampling instant after the thermometer to binary decoder 114 converts, the total number of VCO edges happened in the current sampling period, namely "i". Also, the MLS sequence will be updated to the "i$^{th}$" delay cell or to the (i+1)th cell depending on process, voltage, or temperature (PVT) variations or how small T$_P$ is. The remaining stages will be held to its previous values:

SQ<B> to SQ<i+2>=incorrect values;

SQ<i+1>=undefined state; and

SQ<i> to SQ<A>=correct values.

With respect to the Johnson counter 120, the above SQ values appear if only "i" edges have happened in the sampling period. The multiplexers 110 will update the missing shifts in the codeword between bits SQ<i+1> to SQ<B> until the output MUX<0> to MUX<M−1> reflect what would have occurred if MLS generator 104 had the chance to update the total length of the MLS sequence and the system clock had appeared after the edge at P<B>.

Figure 8C:
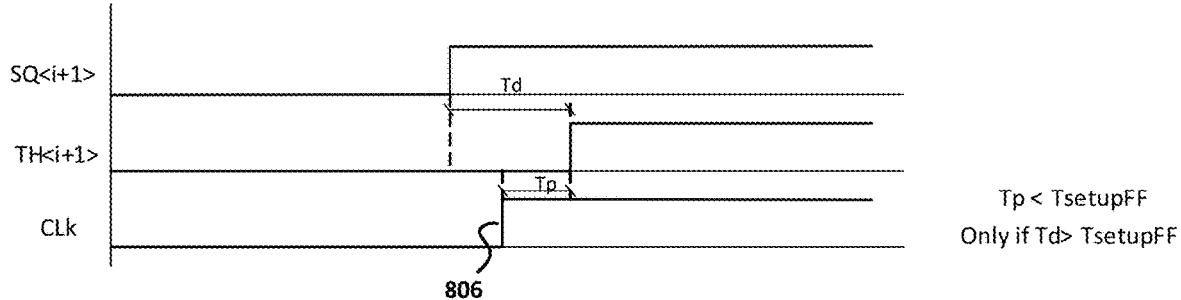

FIG. 8C is a timing diagram in which the signals P<i+1>, CMLS<i>, CJC<i>, and CLK are shown in relation to each other. Each of these signals are shown in FIG. 1B.

In another one of the second operating conditions, the system CLK edge 806 transitions between the rising (or falling) edges of the Johnson counter 120 and the MLS generator 118 and there is no setup violation in the sampling registers Register$_{SQ}$ 150 and Register$_{TH}$ 160. In FIG. 8C, the rising edge 806 of the CLK signal happens between the rising edges of CMLS<i+1> and CJC<i+1> but the setup time TsetupFF for signal SQ<i+1> in Register$_{SQ}$ 150 is respected. This situation is equivalent to situation in FIG. 9B because TH<i+1> will not be updated before the rising edge 806 of the CLK signal.

Figure 8D:
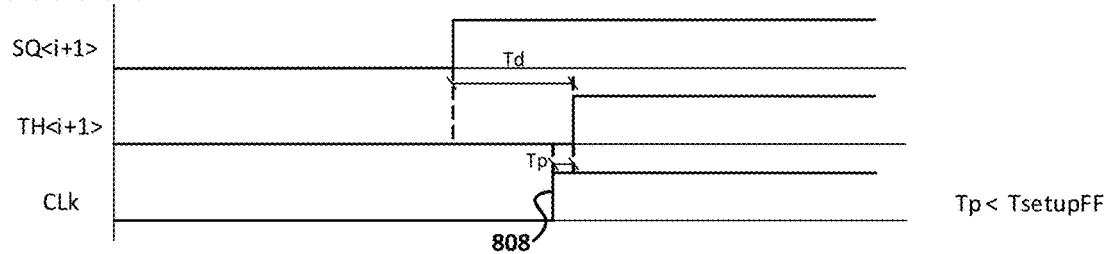

FIG. 8D is a timing diagram in which the signals P<i+1>, CMLS<i>, CJC<i>, and CLK are shown in relation to each other. Each of these signals are shown in FIG. 1B.

In another one of the second operating conditions the system clock edge 808 transitions between the rising (or falling) edges of the Johnson counter 120 and the MLS generator 118 and there is a setup violation in the sampling registers Register$_{SQ}$ 150 and Register$_{TH}$ 160. In FIG. 8D, the rising edge 808 of the CLK signal occurs between the rising edges of CMLS<i+1> and CJC<i+1> but the setup time TsetupFF for signal TH<i+1> in Register$_{TH}$ 160 is not respected. In this situation each possible outcome (that TH<i+1> has triggered corresponding flip-flops or not) will result in estimating the number of edges to be "i" or "i+1" causing an error of one LSB but the MLS sequence will be correctly updated.

Figures 9A, 9B, 9C, 9D, 9E, 9F, 9G, 9H:
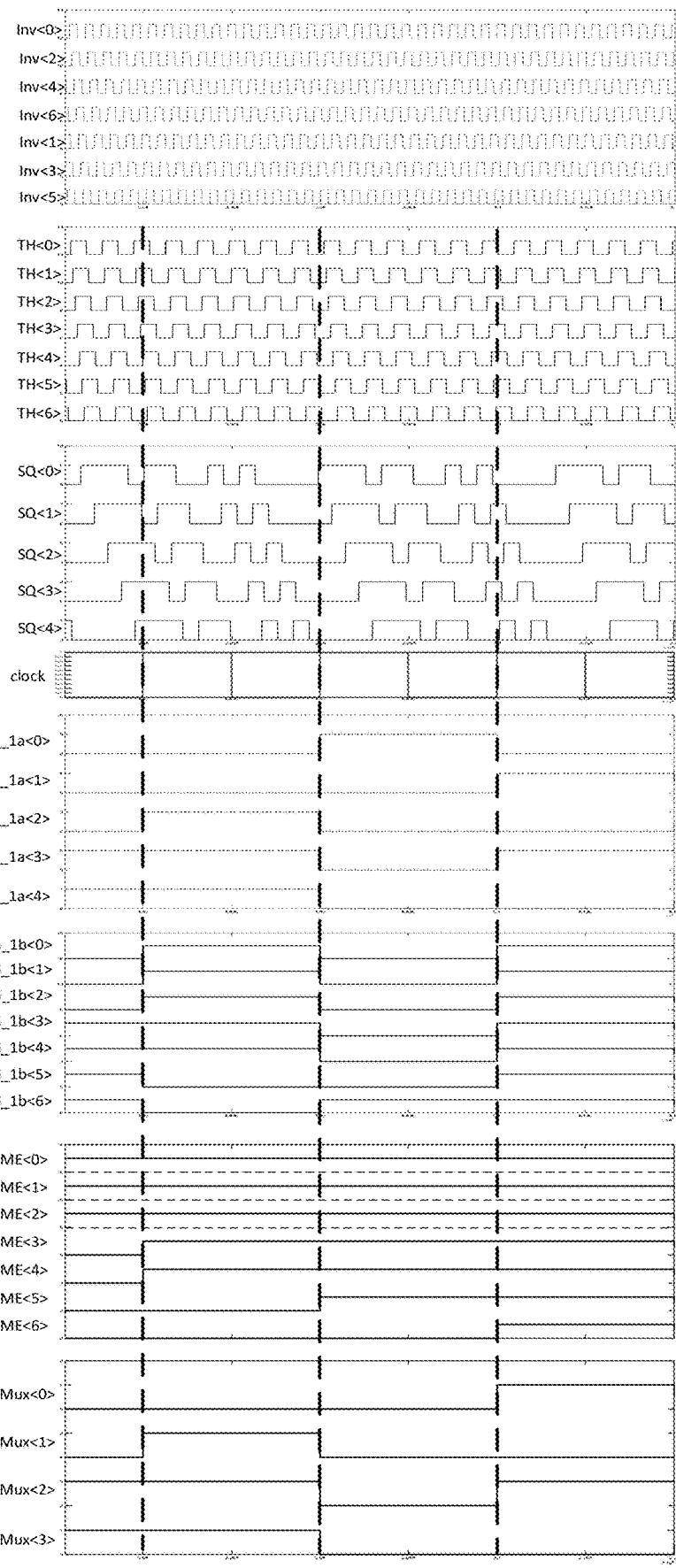
FIGS. 9A, 9B, 9C, 9D, 9E, 9F, 9G, and 9H are a second set of timing diagrams associated with the ADC of FIG. 1B.

FIGS. 9A, 9B, 9C, 9D, 9E, 9F, 9G, and 9H are a series of corresponding sequential timing diagrams that show the digital waveforms associated with certain internal nodes from near the analog input node to near the digital output node of the ADC, according to an embodiment. For example, FIG. 9A shows the Inv signals, FIG. 9B shows the TH signals, FIG. 9C shows the SQ signals, FIG. 9D shows the CLK signal, FIG. 9E shows the RG$_{1A}$ signals, FIG. 9F shows the RG$_{1B}$ signals, FIG. 9G shows the ME signals, and FIG. 9H shows the Mux signals, wherein all signal groups have been previously described. The timing diagrams of FIGS. 9A through 9H thus help to illustrate the progression of the digital signal processing signals through the entirety of the ADC system during the same operating time period. Other operating time periods will have other corresponding timing diagrams. The digital timing diagrams of FIGS. 9A through 9H will also change with variations in the analog input signal.

Figure 10:
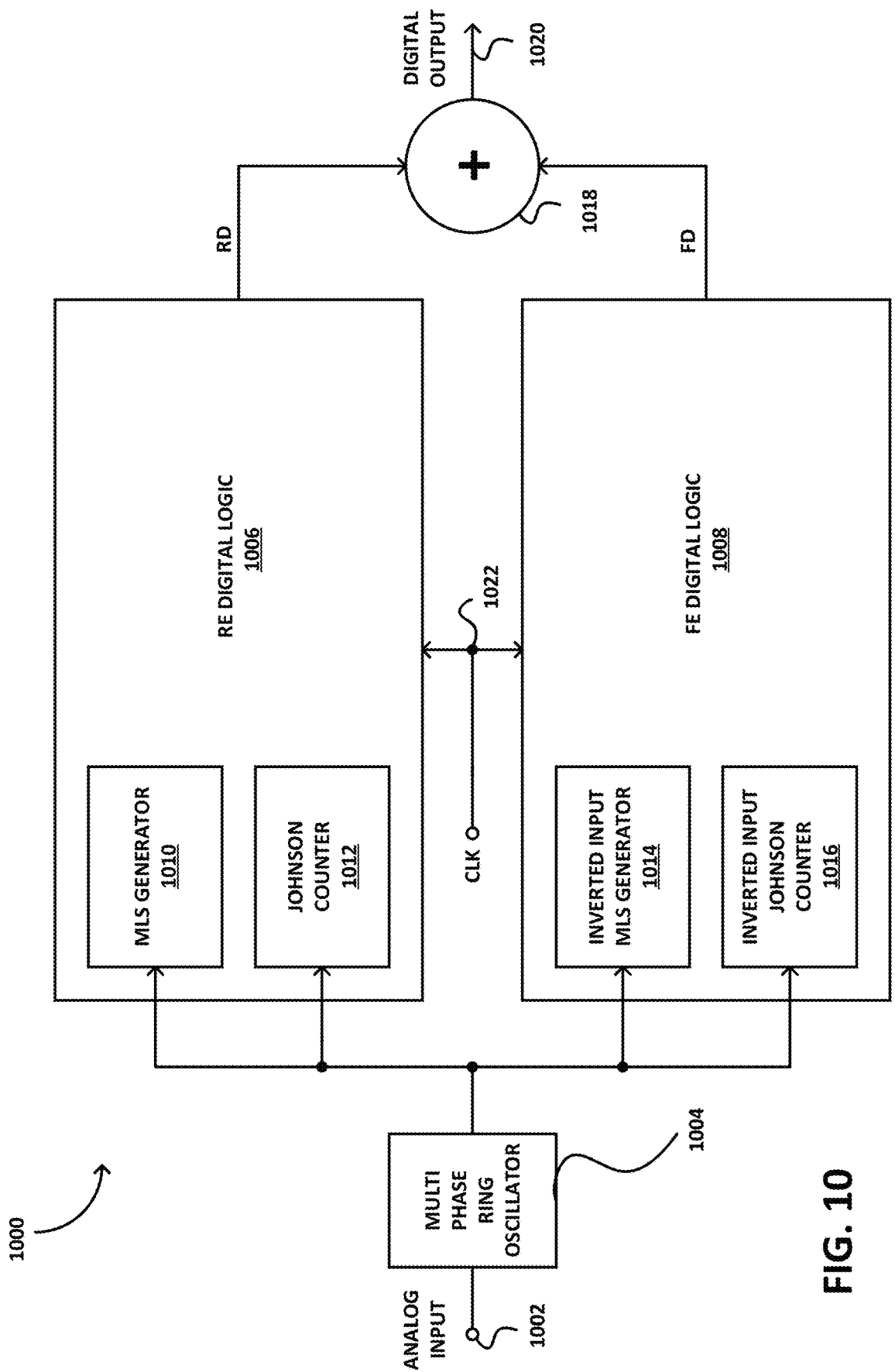
FIG. 10 is a block diagram of an ADC according to another embodiment.

FIG. 10 is a high level block diagram of an ADC 1000 according to another embodiment. ADC 1000 includes an analog input 1002 for receiving an analog input signal that is converted into a digital output signal at digital output 1020. Multiphase ring oscillator 1004 converts the analog input signal into a plurality of phase signals as previously described, which are received by a first digital logic circuit 1006 designated the RE Digital Logic circuit, and a second digital logic circuit 1008 designated the FE Digital Logic circuit. The first digital logic circuit 1006 includes an MLS generator 1010 and a Johnson counter as previously described, which are in communication with additional circuit components substantially as described, with respect to, for example, FIGS. 1A and 1B. The first digital logic circuit 1006 also receives the CLK signal 1022, also as previously described. The second digital logic circuit 1008 includes an inverted input MLS generator 1014 and an inverted input Johnson counter 1016, which are in communication with additional circuit components substantially as described, with respect to, for example, FIGS. 1A and 1B. The second digital logic circuit 1008 also receives the CLK signal 1022, also as previously described. The RD output of the first digital logic circuit 1006 is summed to the FD output of the second digital logic circuit 1008 through summer 1018 to provide a composite digital output signal at digital output 1020 as shown. ADC 1000 provides even greater resolution and power savings than the ADC previously described with respect to FIGS. 1A and 1B as is described in further detail below.

In the ADC embodiments described with respect to FIGS. 1A and 1B, only one edge polarity of the pulses generated by the different phases of the VCOs, either positive or negative, is used (counted). However, both the positive and the negative polarities of the pulses are counted, the resolution of the ADC (such as the embodiment ADC 1000 shown in FIG. 10) can be doubled. Alternatively, the power of the ADC can be reduced by halving the oscillation frequency of the VCOs but maintaining the same number of counts by counting both the rising and falling edges of the pulses. Halving the frequency of the VCO reduces the power because the current required to drive the VCO to half the frequency can be smaller than in the case of counting a single edge polarity only.

As previously discussed, FIG. 10 shows an example of the operation of a system embodied by ADC 1000 that counts both rising and falling edges of the multiphase ring oscillator 1004. Note that MLS generator 1010 and Johnson counter 1012 include "normal" or non-inverting inputs, whereas MLS generator 1014 and Johnson counter 1016 include inverting inputs. In this architecture the digital counting blocks are doubled (one in the first digital logic circuit 1006 and one if the second digital logic circuit 1008). In FIG. 10 the first digital circuit 1006 (RE-Digital Logic) is similar to the system described with respect to FIG. 1B and all flip-flops connected to the VCO phases are triggered by rising edges. In FIG. 10 the second digital circuit 1008 (FE-Digital Logic) is also similar to the system described with respect to FIG. 7 but all flip-flops connected to the VCO phases are triggered by falling edges. The digital outputs of the first logic circuit 1006 (RE-Digital Logic) and the second logic circuit 1008 (FE-Digital Logic) are obtained in busses "RD" and "FD" respectively. Finally, to generate the ADC digital output, the contents of "RD" and "FD" are added together to form a composite output digital signal at node 1020.

Example embodiments of the present invention are summarized below. Other example embodiments can also be understood from the entirety of the specification and the claims filed herein.

Example 1. According to an embodiment, an analog-to-digital converter comprises a ring oscillator having an input for receiving an analog signal, and an output; a coarse counter comprising a maximum length sequence generator having an input coupled to the output of the ring oscillator, and an output; a fine counter comprising a Johnson counter having an input coupled to the output of the ring oscillator, and an output; and a difference generator having a first input coupled to the output of the coarse counter, a second input coupled to the output of the fine counter, and an output for providing a digital signal corresponding to the analog signal.

Example 2. The analog-to-digital converter of Example 1, wherein the maximum length sequence generator comprises a plurality of serially coupled flip-flops having at least one feedback path.

Example 3. The analog-to-digital converter of any of the preceding examples, wherein the coarse counter further comprises a first clocked register coupled to the maximum length sequence generator.

Example 4. The analog-to-digital converter of any of the preceding examples, wherein the Johnson counter comprises a plurality of serially coupled flip-flops having at least one feedback path.

Example 5. The analog-to-digital converter of any of the preceding examples, wherein the fine counter further comprises a second clocked register coupled to the Johnson counter.

Example 6. The analog-to-digital converter of any of the preceding examples, wherein the difference generator further comprises a third clocked register.

Example 7. The analog-to-digital converter of any of the preceding examples, further comprising a metastability error correction circuit interposed between the output of the coarse counter and the first input of the difference generator.

Example 8. The analog-to-digital converter of any of the preceding examples, wherein the metastability error correction circuit comprises a plurality of multiplexers.

Example 9. The analog-to-digital converter of any of the preceding examples, further comprising a maximum length sequence descrambler circuit interposed between the output of the coarse counter and the first input of the difference generator.

Example 10. The analog-to-digital converter of any of the preceding examples, further comprising a Johnson count-to-binary count converter interposed between the output of the fine counter and the second input of the difference generator.

Example 11. The analog-to-digital converter of any of the preceding examples, wherein the Johnson count-to-binary count converter comprises a Johnson count-to-thermometer counter converter coupled to a thermometer count-to-binary count converter.

Example 12. The analog-to-digital converter of any of the preceding examples, further comprising an additional coarse counter and an additional fine counter.

Example 13. The analog-to-digital converter of any of the preceding examples, wherein the additional coarse counter comprises an inverting input, and wherein the additional fine counter comprises an inverting input.

Example 14. According to another embodiment, a method for converting an analog signal into a digital output comprises converting the analog signal into a plurality of phase signals including a primary phase signal and a plurality of secondary phase signals; registering edges of the primary phase signal using a maximum length sequence code count; calculating a number of the registered edges of the primary phase signal during a sampling period; estimating a coarse output based upon the calculated number of registered edges of the primary phase signal during the sampling period; registering edges of the plurality of secondary phase signals using a Johnson count; calculating a number of the registered edges of the plurality of secondary phase signals during the sampling period; generating a correction output based upon the calculated number of registered edges of the plurality of secondary phase signals during the sampling period; and adding the coarse output and the correction output together to provide the digital output.

Example 15. The method of Example 14, wherein registering the edges of the plurality of secondary phase signals is substantially asynchronous with registering the edges of the primary phase signal.

Example 16. The method of any of the preceding examples, wherein registering the edges of the plurality of secondary phase signals comprises phase sampling the plurality of secondary phase signals to generate a plurality of sampled secondary phase signals.

Example 17. The method of any of the preceding examples, further comprising correcting metastability errors in the registered edges of the primary phase signal.

Example 18. The method of any of the preceding examples, further comprising converting the registered edges of the plurality of secondary phase signals from a Johnson count to a thermometer count.

Example 19. The method of any of the preceding examples, further comprising converting the thermometer count to a binary count.

Example 20. The method of any of the preceding examples, wherein adding the coarse output and the correction output further comprises adding a first difference of the coarse output and a first difference of the correction output.

Example 21. The method of any of the preceding examples, wherein registering edges of the primary phase signal using a maximum length sequence code count comprises registering edges of the primary phase signal using first and second maximum length sequence code counts.

Example 22. The method of any of the preceding examples, wherein registering edges of the secondary phase signal using a Johnson count comprises registering edges of the secondary phase signal using first and second Johnson counts.

Example 23. According to another embodiment, an analog-to-digital converter comprises a ring oscillator having an input for receiving an analog signal, and an output; a maximum length sequence generator having an input coupled to the output of the ring oscillator, and an output; a Johnson counter having an input coupled to the output of the ring oscillator, and an output; and an adder having a first input coupled to the output of the maximum length sequence generator, a second input coupled to the output of the Johnson counter, and an output for providing a digital signal corresponding to the analog signal.

Example 24. The analog-to-digital converter of Example 23, further comprising a metastability error correction circuit and a maximum length sequence generator interposed between the maximum length sequence generator and the adder; and a Johnson count-to-binary count converter interposed between the Johnson counter and the adder.

Example 25. The analog-to-digital converter of any of the preceding examples, further comprising an additional maximum length sequence generator and an additional Johnson counter.

Example 26. The analog-to-digital converter of any of the preceding examples, wherein the additional maximum length sequence generator comprises an inverting input, and wherein the additional Johnson counter comprises an inverting input.

It is an advantage that the implementation of embodiment concepts, methods, and ADC component selection results in a significant reduction in power and/or increase in resolution, and a significant reduction in metastability and desynchronization errors when compared to prior art ADC solutions.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An analog-to-digital converter comprising:
   a ring oscillator having an input for receiving an analog signal, and an output;
   a coarse counter comprising a maximum length sequence generator having an input coupled to the output of the ring oscillator, and an output;
   a fine counter comprising a Johnson counter having an input coupled to the output of the ring oscillator, and an output;
   a difference generator having a first input coupled to the output of the coarse counter, a second input coupled to the output of the fine counter, and an output for providing a digital signal corresponding to the analog signal; and
   a metastability error correction circuit interposed between the output of the coarse counter and the first input of the difference generator.

2. The analog-to-digital converter of claim 1, wherein the maximum length sequence generator comprises a plurality of serially coupled flip-flops having at least one feedback path.

3. The analog-to-digital converter of claim 1, wherein the coarse counter further comprises a first clocked register coupled to the maximum length sequence generator.

4. The analog-to-digital converter of claim 1, wherein the Johnson counter comprises a plurality of serially coupled flip-flops having at least one feedback path.

5. The analog-to-digital converter of claim 1, wherein the fine counter further comprises a second clocked register coupled to the Johnson counter.

6. The analog-to-digital converter of claim 1, wherein the difference generator further comprises a third clocked register.

7. The analog-to-digital converter of claim 1, wherein the metastability error correction circuit comprises a plurality of multiplexers.

8. The analog-to-digital converter of claim 1, further comprising a maximum length sequence descrambler circuit interposed between the output of the coarse counter and the first input of the difference generator.

9. The analog-to-digital converter of claim 1, further comprising a Johnson count-to-binary count converter interposed between the output of the fine counter and the second input of the difference generator.

10. The analog-to-digital converter of claim 9, wherein the Johnson count-to-binary count converter comprises a Johnson count-to-thermometer counter converter coupled to a thermometer count-to-binary count converter.

11. The analog-to-digital converter of claim 1, further comprising an additional coarse counter and an additional fine counter.

12. The analog-to-digital converter of claim 11, wherein the additional coarse counter comprises an inverting input, and wherein the additional fine counter comprises an inverting input.

13. A method for converting an analog signal into a digital output comprising:
   converting the analog signal into a plurality of phase signals including a primary phase signal and a secondary phase signal;
   registering edges of the primary phase signal using a maximum length sequence code count;
   calculating a number of the registered edges of the primary phase signal during a sampling period;
   estimating a coarse output based upon the calculated number of registered edges of the primary phase signal during the sampling period;
   registering edges of the secondary phase signal using a Johnson count;
   calculating a number of the registered edges of the secondary phase signal during the sampling period;
   generating a correction output based upon the calculated number of registered edges of the secondary phase signal during the sampling period; and
   adding the coarse output and the correction output together to provide the digital output.

14. The method of claim 13, wherein registering the edges of the secondary phase signal is substantially asynchronous with registering the edges of the primary phase signal.

15. The method of claim 13, wherein registering the edges of the secondary phase signal comprises phase sampling the secondary phase signal to generate a sampled secondary phase signal.

16. The method of claim 13, further comprising correcting metastability errors in the registered edges of the primary phase signal.

17. The method of claim 13, further comprising converting the registered edges of the secondary phase signal from a Johnson count to a thermometer count.

18. The method of claim 17, further comprising converting the thermometer count to a binary count.

19. The method of claim 13, wherein adding the coarse output and the correction output further comprises adding a first difference of the coarse output and a first difference of the correction output.

20. The method of claim 13, wherein registering edges of the primary phase signal using a maximum length sequence code count comprises registering edges of the primary phase signal using first and second maximum length sequence code counts.

21. The method of claim 13, wherein registering edges of the secondary phase signal using a Johnson count comprises registering edges of the secondary phase signal using first and second Johnson counts.

22. An analog-to-digital converter comprising:
   a ring oscillator having an input for receiving an analog signal, and an output;
   a maximum length sequence generator having an input coupled to the output of the ring oscillator, and an output;
   a Johnson counter having an input coupled to the output of the ring oscillator, and an output;
   an adder having a first input coupled to the output of the maximum length sequence generator, a second input coupled to the output of the Johnson counter, and an output for providing a digital signal corresponding to the analog signal;
   a metastability error correction circuit and a maximum length sequence generator interposed between the maximum length sequence generator and the adder; and
   a Johnson count-to-binary count converter interposed between the Johnson counter and the adder.

23. The analog-to-digital converter of claim 22, further comprising an additional maximum length sequence generator and an additional Johnson counter.

24. The analog-to-digital converter of claim 23, wherein the additional maximum length sequence generator comprises an inverting input, and wherein the additional Johnson counter comprises an inverting input.

25. An analog-to-digital converter comprising:
- a ring oscillator having an input for receiving an analog signal, and an output;
- a coarse counter comprising a maximum length sequence generator having an input coupled to the output of the ring oscillator, and an output;
- a fine counter comprising a Johnson counter having an input coupled to the output of the ring oscillator, and an output;
- a difference generator having a first input coupled to the output of the coarse counter, a second input coupled to the output of the fine counter, and an output for providing a digital signal corresponding to the analog signal; and
- a maximum length sequence descrambler circuit interposed between the output of the coarse counter and the first input of the difference generator.

* * * * *